US009151590B2

(12) United States Patent
Knaak (10) Patent No.: US 9,151,590 B2
(45) Date of Patent: Oct. 6, 2015

(54) PROXIMITY SENSOR AND METHOD FOR DETERMINING THE PROXIMITY TO AN ELECTRICALLY CONDUCTIVE BODY (71) Applicant: Atlas Elektronik GMBH, Bremen (DE)

(72) Inventor: Heinz Knaak, Uetersen (DE)

(73) Assignee: Atlas Elektronik GmbH (DE)

( * ) Notice: Subject to any disclaimer, the term of this patent is extended or adjusted under 35 U.S.C. 154(b) by 465 days.

(21) Appl. No.: 13/772,379

(22) Filed: Feb. 21, 2013

(65) Prior Publication Data

US 2013/0229174 A1    Sep. 5, 2013

(30) Foreign Application Priority Data

Mar. 1, 2012 (DE) .......................... 10 2012 004 308

(51) Int. Cl.
*G01B 7/02* (2006.01)
*H03K 17/95* (2006.01)
*F41G 9/00* (2006.01)
*G01V 3/10* (2006.01)

(52) U.S. Cl.
CPC ................ *G01B 7/023* (2013.01); *F41G 9/008* (2013.01); *G01V 3/10* (2013.01); *H03K 17/9502* (2013.01); *H03K 17/954* (2013.01)

(58) Field of Classification Search
None
See application file for complete search history.

(56) References Cited

U.S. PATENT DOCUMENTS

| | | | | |
|---|---|---|---|---|
| 2,830,263 A * | 4/1958 | Shapiro | ......................... | 324/226 |
| 3,328,680 A * | 6/1967 | Singer | ............................. | 324/239 |
| 3,700,101 A * | 10/1972 | Ference et al. | ................. | 209/564 |
| 3,747,012 A * | 7/1973 | Buck | ................................ | 331/65 |
| 4,021,725 A * | 5/1977 | Kirkland | ........................ | 324/326 |
| 4,079,323 A * | 3/1978 | Blanyer | ......................... | 307/652 |
| 4,124,792 A * | 11/1978 | Flora et al. | ................ | 219/124.34 |
| 4,135,124 A * | 1/1979 | Buck | .............................. | 327/438 |
| 4,424,458 A * | 1/1984 | Buck et al. | ....................... | 327/75 |

(Continued)

FOREIGN PATENT DOCUMENTS

| | | |
|---|---|---|
| DE | 3704893 A1 | 8/1988 |
| DE | 3908576 A1 | 9/1990 |

(Continued)

OTHER PUBLICATIONS

International Search Report from corresponding DE 10 2012 004 308.2 filed Mar. 1, 2012.

*Primary Examiner* — Patrick Assouad
*Assistant Examiner* — Suresh K Rajaputra
(74) *Attorney, Agent, or Firm* — Polster Lieder (57) ABSTRACT A method for determining the proximity to an electrically conductive body comprises transmitting an alternating magnetic field at a selected frequency and registering an alternating magnetic field. Frequencies of the registered alternating magnetic field comprising the selected frequency and have an amplitude value above a predefined threshold value and are detected by a detection means. Utilizing a blocking circuit, frequencies of a predefined frequency band comprising the detected frequency or a plurality of predefined frequency bands comprising in each case one of the detected frequencies, are defined as blocked frequencies. A following frequency following the respective selected frequency and different from the selected frequency and the blocked frequencies is defined in a selection controller. The following frequency of a selected frequency is continuously selected as a newly selected frequency for a new time window following immediately after or chronologically spaced apart from a selected time window.

13 Claims, 4 Drawing Sheets

(56) References Cited

U.S. PATENT DOCUMENTS

| | | | |
|---|---|---|---|
| 4,514,692 A * | 4/1985 | Johnson et al. | 324/329 |
| 4,587,448 A * | 5/1986 | Batterman | 327/33 |
| 4,766,385 A * | 8/1988 | Polvani | 324/345 |
| 4,841,163 A * | 6/1989 | Mueller | 307/116 |
| 4,843,259 A * | 6/1989 | Weisshaupt | 327/510 |
| 5,258,709 A * | 11/1993 | Laukien | 324/300 |
| 5,361,072 A * | 11/1994 | Barrick et al. | 342/133 |
| 5,425,073 A * | 6/1995 | Bitzer et al. | 377/17 |
| 5,619,188 A * | 4/1997 | Ehlers | 340/686.6 |
| 6,031,377 A * | 2/2000 | Watkins | 324/345 |
| 6,043,644 A * | 3/2000 | de Coulon et al. | 324/207.18 |
| 6,236,200 B1 * | 5/2001 | Nekado et al. | 324/207.26 |
| 6,452,396 B2 * | 9/2002 | Ott et al. | 324/327 |
| 6,496,713 B2 * | 12/2002 | Avrin et al. | 600/409 |
| 6,529,007 B2 * | 3/2003 | Ott et al. | 324/327 |
| 7,010,066 B2 * | 3/2006 | Sullivan | 375/343 |
| 7,078,906 B2 * | 7/2006 | Nelson | 324/327 |
| 7,130,602 B2 * | 10/2006 | Ciccarelli | 455/240.1 |
| 7,174,269 B2 * | 2/2007 | Ai et al. | 702/142 |
| 7,227,466 B2 * | 6/2007 | Nelson | 340/551 |
| 7,248,208 B2 * | 7/2007 | Hager et al. | 342/120 |
| 7,298,261 B2 * | 11/2007 | Fujimori et al. | 340/551 |
| 7,355,409 B2 * | 4/2008 | Larsen | 324/326 |
| 7,479,920 B2 * | 1/2009 | Niv | 342/65 |
| 7,480,324 B2 * | 1/2009 | Aiello et al. | 375/130 |
| 7,508,337 B2 * | 3/2009 | Morinaga et al. | 342/109 |
| 7,528,606 B1 * | 5/2009 | In et al. | 324/326 |
| 7,567,202 B2 * | 7/2009 | Pearson et al. | 342/81 |
| 7,576,688 B2 * | 8/2009 | Lehtinen | 342/196 |
| 7,579,988 B2 * | 8/2009 | Xu et al. | 342/417 |
| 7,626,536 B1 * | 12/2009 | Rihaczek et al. | 342/96 |
| 7,667,639 B2 * | 2/2010 | Cheng et al. | 342/174 |
| 7,688,251 B2 * | 3/2010 | Barrick et al. | 342/104 |
| 7,688,257 B1 * | 3/2010 | Christianson et al. | 342/174 |
| 7,692,575 B2 * | 4/2010 | Nishimura | 342/147 |
| 7,719,263 B2 * | 5/2010 | Eissner et al. | 324/207.15 |
| 7,750,841 B2 * | 7/2010 | Oswald et al. | 342/147 |
| 7,847,539 B2 * | 12/2010 | Machul et al. | 324/207.15 |
| 7,847,556 B2 * | 12/2010 | Royle | 324/326 |
| 7,924,214 B2 * | 4/2011 | Ando | 342/70 |
| 7,982,661 B2 * | 7/2011 | Beasley | 342/128 |
| 7,994,778 B2 * | 8/2011 | Kirchdoerffer et al. | 324/207.26 |
| 8,031,109 B2 * | 10/2011 | Barrick et al. | 342/175 |
| 8,115,480 B2 * | 2/2012 | Masubuchi et al. | 324/227 |
| 8,159,396 B2 * | 4/2012 | Folden et al. | 342/458 |
| 8,179,124 B2 * | 5/2012 | De Huu et al. | 324/207.11 |
| 8,255,149 B2 * | 8/2012 | Brosius et al. | 701/484 |
| 8,319,500 B2 * | 11/2012 | Tillotson | 324/522 |
| 8,400,349 B1 * | 3/2013 | Dubbert et al. | 342/113 |
| 8,416,123 B1 * | 4/2013 | Mitchell et al. | 342/107 |
| 8,432,169 B2 * | 4/2013 | Niwa et al. | 324/652 |
| 8,457,177 B2 * | 6/2013 | Sullivan | 375/147 |
| 8,521,198 B2 * | 8/2013 | Ciccarelli et al. | 455/501 |
| 8,575,929 B1 * | 11/2013 | Wiegert | 324/245 |
| 8,618,791 B2 * | 12/2013 | Grinberg et al. | 324/207.15 |
| 8,630,796 B2 * | 1/2014 | Sullivan et al. | 701/408 |
| 8,729,902 B1 * | 5/2014 | Kelley et al. | 324/329 |
| 8,781,426 B2 * | 7/2014 | Ciccarelli et al. | 455/234.1 |
| 8,823,581 B2 * | 9/2014 | Mostov et al. | 342/128 |
| 2003/0029345 A1 * | 2/2003 | Tiernan et al. | 102/221 |
| 2010/0171491 A1 * | 7/2010 | Chana | 324/207.25 |

FOREIGN PATENT DOCUMENTS

| | | |
|---|---|---|
| DE | 19815342 A1 | 11/1999 |
| DE | 102007007551 A1 | 8/2008 |

* cited by examiner

PROXIMITY SENSOR AND METHOD FOR DETERMINING THE PROXIMITY TO AN ELECTRICALLY CONDUCTIVE BODY

CROSS-REFERENCE TO RELATED APPLICATIONS

This application claims the benefit, under 35 U.S.C. §119, of DE 10 2012 004 308.2, filed Mar. 1, 2012, the disclosure of which is incorporated herein by reference in its entirety.

FIELD

The invention relates to a proximity sensor for determining the proximity to an electrically conductive body and a method for determining the proximity to an electrically conductive body.

BACKGROUND

Proximity sensors are conventionally used for determining the proximity to an electrically conductive body, the proximity sensors having a transmitting arrangement with an oscillating circuit. An electrical oscillation at a selected predefined frequency is produced by the oscillating circuit. The electrical oscillation, in turn, produces an alternating magnetic field which is transmitted by a coil of the oscillating circuit and has the same frequency as the electrical oscillation. The transmitted alternating magnetic field is propagated from the proximity sensor and, if an electrically conductive body is located in the region of the transmitted alternating magnetic field, hits the electrically conductive body. An alternating current, which is also known as an eddy current, is produced in the electrically conductive body by the transmitted alternating magnetic field. The eddy current results in an alternating magnetic field which has the same frequency as the transmitted alternating magnetic field.

Such proximity sensors also have a receiving arrangement, by means of which an alternating magnetic field is registered. In particular, the alternating magnetic field which is transmitted back from the electrically conductive body is registered by means of the receiving arrangement. By comparing the transmitted and the registered alternating magnetic fields, for example by comparing the maximum amplitudes thereof and/or the phase shift thereof, the proximity and/or the degree of proximity of the electrically conductive body to the proximity sensor may be determined.

When determining the proximity, however, false values occur when interfering alternating magnetic fields are present in the region of the receiving arrangement, in particular at the same frequency as the respectively transmitted frequency of the transmitted alternating magnetic fields. The interfering alternating magnetic fields may occur, for example, as a result of electric motors or other interfering devices present in the vicinity.

SUMMARY

The object of the invention, therefore, is to find a proximity sensor and a method for determining the proximity to an electrically conductive body which permit the proximity to be reliably determined, irrespective of interfering alternating magnetic fields.

The invention achieves this object by a proximity sensor for determining the proximity to an electrically conductive body and a method for determining the proximity to an electrically conductive body, as described and claimed below.

To this end, the proximity sensor according to the invention for determining the proximity comprises a transmitting arrangement by which an alternating magnetic field is transmitted. The alternating magnetic field in this case has a frequency which corresponds to a selected frequency. Chronologically, the frequency is transmitted in each case for a predetermined and/or predefined time window, the frequency corresponding to the times of the current time window of the current selected frequency.

An alternating magnetic field corresponds to a magnetic field, the field strength thereof changing temporarily at a predefined frequency. In this case, a changing field strength which varies between negative and positive maxima is possible, the field lines thereof thus extending periodically in opposing directions. A changing field strength which varies between positive minima and maxima or negative minima and maxima is also possible. Moreover, the invention comprises a receiving arrangement for registering an alternating magnetic field. The receiving arrangement is, for example, an oscillating circuit, the electrical oscillation thereof produced by the registered alternating magnetic field being measured.

According to the invention, the proximity sensor comprises a detection means, by means of which one or more frequencies of the registered alternating magnetic field are picked up and/or detected when the frequencies are outside a predefined frequency band having the selected frequency and have an amplitude value above a predefined threshold value.

Individual frequencies which occur in the registered alternating magnetic field, therefore, are initially considered by means of a detection means. To this end, for example, an electrical signal from the alternating magnetic field is generated, amplified and/or mixed and transformed into the spectral range, for example by means of a Fourier transformation. Thus, all frequency lines in the spectral range are detected which do not correspond to the frequency line of the selected transmitted frequency or which are not in a predefined range, i.e. a predefined frequency band around the frequency line of the selected transmitted frequency and which in each case additionally have an amplitude which is above a predefined threshold value. The detected frequencies are then transferred to a blocking circuit of a control logic.

In the case of a detected frequency, the frequencies which are in a predefined frequency band having the detected frequency are defined as blocked frequencies by means of the blocking circuit. "Predefined frequency band" means a frequency band which is defined, for example, in bandwidth and/or relative to the mean frequency—relative to the respectively detected frequency. In the case of a plurality of detected frequencies, the frequencies which in each case are in one of a plurality of predefined frequency bands having in each case at least one of the detected frequencies are defined as blocked frequencies. The blocked frequencies are defined by the blocking circuit as blocked frequencies for a predefined time period.

The control logic also has a selection controller. When determining the proximity, the selection controller serves for the continuous and repeated defining of one respective frequency following the respective currently selected frequency. The frequency following the respective currently selected frequency is denoted as the following frequency of the currently selected frequency. In this case, a following frequency is defined such that the frequency differs from the selected frequency which is followed by the following frequency. Moreover, the following frequency is selected and/or defined such that the frequency differs from the frequencies blocked at that time. When defining the following frequency of a currently selected frequency, therefore, the respective currently selected frequency as well as the blocked frequencies are excluded.

In a time control, a following frequency of the currently selected frequency is continuously selected as a newly selected frequency, so that in successive time windows continually variable frequencies are selected which do not correspond to one of the blocked frequencies. The following frequency is thus selected for a time window following the current time window, which follows immediately after or is chronologically spaced apart from the current time window.

The invention further comprises a method for determining the proximity to an electrically conductive body. In the method, an alternating magnetic field is transmitted at a selected frequency in a transmitting step and an alternating magnetic field is registered in a receiving step. In a detection step, one or more frequencies of the detected alternating magnetic field which are outside a predefined frequency band having the selected frequency and have an amplitude value above a predefined threshold value are detected.

The frequencies detected in the detection step are processed further in a blocking step of a control step. In the blocking step, frequencies of a predefined frequency band having the detected frequency or a plurality of predefined frequency bands having in each case at least one of the detected frequencies are defined for a predefined time period as blocked frequencies. In a selection step of the control step, a frequency following the currently selected frequency and different from the respective currently selected frequency, which is denoted as the following frequency of the respective currently selected frequency, is continuously selected. When selecting and/or defining the following frequency, the blocked frequencies are excluded.

In a time control step of the control step, the following frequency of a currently selected frequency is continuously, i.e. repeatedly as time progresses, defined and/or selected as a newly selected frequency. This following frequency is selected as the selected frequency for a subsequent new time window, following immediately after or chronologically spaced apart from the current time window.

As a result of the invention, determining the proximity to an electrically conductive body is possible even when interfering alternating magnetic fields are registered by the receiving arrangement. This is possible as the selected frequency always differs from the frequencies of interfering alternating magnetic fields, by means of the frequencies detected by the detection means and blocked by the blocking circuit.

According to an embodiment of the proximity sensor, the transmitting arrangement has an oscillating circuit comprising at least one coil and a plurality of capacitors able to be connected in parallel in any combination with one another, in each case by switches. The oscillating circuit serves for producing an electrical oscillation at the selected frequency and an alternating magnetic field at the same frequency resulting from the oscillation. The control logic further comprises activation means for activating the switches. By activating the switches, the total capacity of the oscillating circuit varies and thus the frequency of the electrical oscillation is switched over.

According to an embodiment of the method, in the transmitting step, an electrical oscillation is produced at the selected frequency by means of an oscillating circuit and an alternating magnetic field resulting from the electrical oscillation is produced at the same frequency. By switching the switches of the oscillating circuit into an activation step of the control step, the frequency of the electrical oscillation is switched over.

According to a further embodiment, the oscillating circuit has a controlled voltage source or current source, for example a DC voltage circuit connected thereto, in order to stimulate and maintain the oscillation in the oscillating circuit and to control the amplitude of the oscillation, for example by keeping the amplitude constant.

Such an oscillating circuit permits an electrical oscillation to be produced at a frequency which is substantially constant in time windows, and which may also still be varied by switching the switches.

According to a further embodiment, the transmitting arrangement has at least one sensor for measuring and/or registering the energy distribution in the oscillating circuit. To this end, for example, the magnetic field strength of the magnetic field produced by the coil and/or the voltage is measured and/or registered via the capacitors. Moreover, the activation means are configured to switch over the switches only in the case of maximum energy or within the range of maximum energy measured in the coil.

According to an embodiment of the method, in the transmitting step the energy distribution within the oscillating circuit is measured by the sensor and in the activation step the switches are switched over depending on the energy distribution in the oscillating circuit.

By switching the switches only if the entire energy and/or substantially the entire energy is present in the coil, it is possible to switch over the switches without load. As a result, energy losses and phase shifts of the electrical oscillation and of the resulting alternating magnetic field are avoided. Overall, therefore, lower energy consumption is required in order to maintain the oscillation in the oscillating circuit despite varying the frequency of the oscillation.

According to a further embodiment, the proximity sensor has an evaluation circuit with an amplitude monitoring circuit for monitoring the amplitude of the selected frequency, a frequency derived from the selected frequency, the envelope of the selected frequency or the envelope of the frequency of the registered alternating magnetic field derived from the selected frequency. In an evaluation step of the proximity sensor, the amplitude is monitored of the selected frequency, a frequency derived from the selected frequency, the envelope of the selected frequency or the envelope of the frequency of the registered alternating magnetic field derived from the selected frequency, in an amplitude monitoring step of the evaluation step.

By means of the amplitude monitoring circuit, for example by comparing the amplitude values and/or values of the monitored amplitude, for example the envelope of the selected frequency of the registered alternating magnetic field, with values stored in a selected table—by considering the amplitude of the selected frequency of the transmitted alternating field—the degree of proximity to an electrically conductive body is determined. Such tables are in this case, for example, predetermined according to the geometric paths of the movement of the proximity sensor towards the electrically conductive body and/or according to the shape and the size and the material of the electrically conductive body and then specifically selected when determining the proximity. Alternatively or additionally, by the proximity sensor passing the electrically conductive body at a maximum monitored amplitude or within the range of the maximum monitored amplitude, for example the envelope of the selected frequency of the registered alternating magnetic field, the shortest distance from the electrically conductive body is determined and/or registered or detected.

According to a further embodiment, the evaluation circuit has a phase monitoring circuit and/or in an evaluation step a phase is monitored by a phase monitoring step. More specifically, by the phase monitoring circuit and/or the phase monitoring step, the phase is monitored of the selected frequency, a frequency derived from the selected frequency, the envelope of the selected frequency or the envelope of the frequency of the registered alternating magnetic field derived from the selected frequency. Phase shifts of the monitored phases are then identified when the monitored phase alters more rapidly in chronological terms than predetermined by a second threshold value. In the case of a "more rapid" phase change and/or a phase shift, the values registered when determining the proximity, i.e. the specific degree of proximity, are rejected and identified as invalid.

By means of the phase monitoring circuit it is possible to identify interfering alternating magnetic fields which, in spite of the detection means, occur "without warning" in the frequency range of the selected frequency, as such alternating magnetic fields which occur without warning generally have a different phase from the transmitted alternating magnetic field.

According to a further embodiment, the evaluation circuit has a frequency mixer and/or the evaluation step has a frequency mixing step. By means of the frequency mixer and/or in the frequency mixing step, electrical signals generated from the registered and transmitted alternating magnetic field are mixed multiplicatively before they are supplied, for example, to the phase monitoring circuit and/or the amplitude monitoring circuit.

Due to this mixing, it is possible to filter the mixed signal in the evaluation circuit and/or in the evaluation step with bandpasses which have been uniquely predefined in each case for a phase monitoring circuit and an amplitude monitoring circuit. Thus it is not necessary to shift the bandpasses in the frequency range as a result of the changing selected frequencies.

According to a further embodiment, the proximity sensor has a memory circuit and a prediction circuit. The time curve of the detected frequencies is stored by means of the memory circuit. Interfering frequencies likely to occur in the future are thus predicted from the time curve by means of the prediction circuit. The predicted frequencies are then supplied to the blocking circuit of the control logic as further detected frequencies. Accordingly, in one embodiment of the method in a storage step, the time curve of the detected frequencies is stored and frequencies which are then supplied to the blocking step as further detected frequencies are predetermined in a prediction step.

By means of the memory circuit and the prediction circuit and/or the memory step and the prediction step it is possible in interfering alternating magnetic fields which change temporarily relative to the frequency, to predict in advance potential interfering frequencies of interfering alternating magnetic fields and to avoid transmitting an alternating magnetic field at these frequencies.

According to a further embodiment, the proximity sensor has a correction circuit by means of which values determined when evaluating the proximity are corrected using knowledge of the detected frequencies. By means of the correction circuit, for example, it is possible to correct the values of the amplitude or phase in the evaluation circuit when the values are influenced by detected frequencies.

DRAWINGS

Further advantageous embodiments are revealed from the exemplary embodiments which are described in more detail with reference to the drawings.

DETAILED DESCRIPTION

The following description is merely exemplary in nature and is in no way intended to limit the present teachings, application, or uses. Throughout this specification, like reference numerals will be used to refer to like elements.

Figure 1:
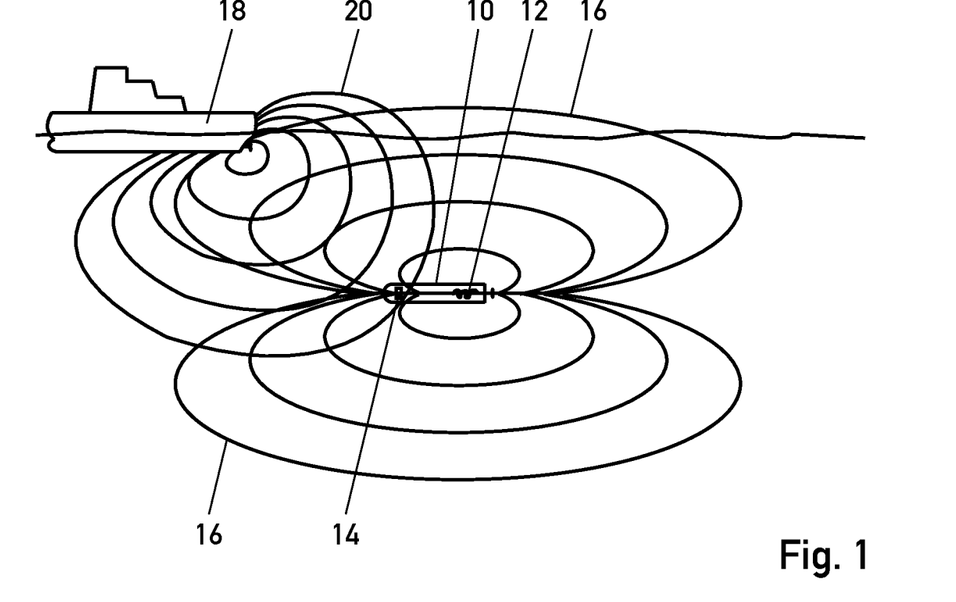
FIG. 1 shows a water craft comprising an exemplary embodiment of a proximity sensor in accordance with various embodiments of the present disclosure.

FIG. 1 shows an exemplary embodiment of a proximity sensor according to the invention which is arranged in an underwater vehicle 10. The underwater vehicle 10, which for example is a torpedo, has in the rear region a transmitting arrangement 12 and in the front region a receiving arrangement 14. The transmitting arrangement 12 is represented by a coil arranged in the longitudinal direction of the water craft and the receiving arrangement 14 is shown arranged in the vertical direction and in the transverse direction of the underwater vehicle 10. An alternating magnetic field 16 is transmitted by means of the transmitting arrangement 12, the alternating magnetic field 16 in this case being represented by way of example by field lines. The transmitted alternating magnetic field 16 hits an electrically conductive body 18 which in this case is shown as a surface ship. In the electrically conductive body 18, in this case in the hull of the surface ship, eddy currents are produced by the transmitted alternating magnetic field 16 which in turn generate an alternating magnetic field 20. The alternating magnetic field 20 generated in the electrically conductive body 18 is registered by the receiving arrangement 14 of the underwater vehicle 10.

Figure 2:
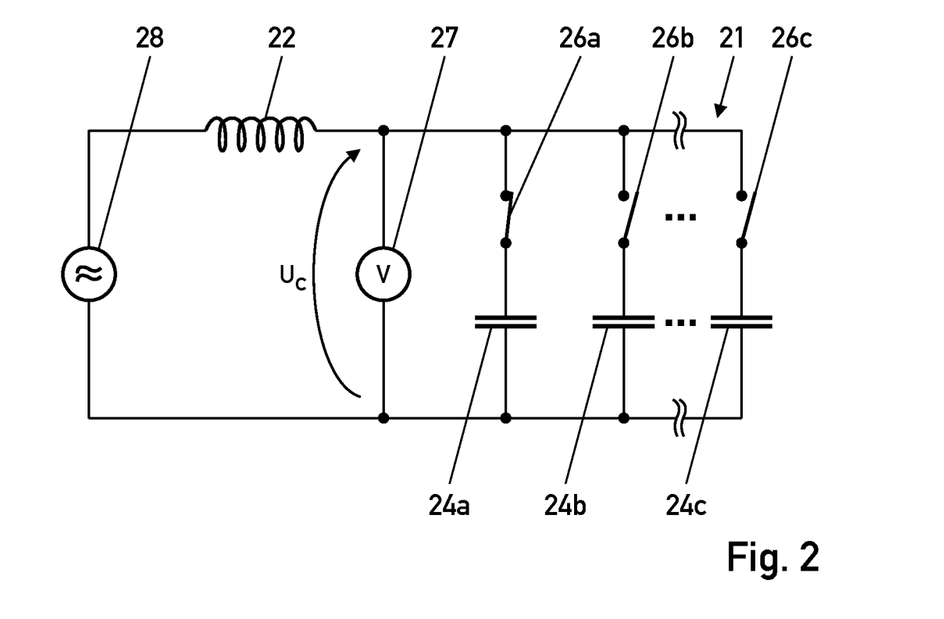
FIG. 2 shows an oscillating circuit of a transmitting arrangement, in accordance with various embodiments of the present disclosure.

FIG. 2 shows an oscillating circuit 21 of an exemplary embodiment of the transmitting arrangement 12. The oscillating circuit 21 has a coil 22, three capacitors 24a to 24c, three switches 26a to 26c, a sensor 27 and a controlled voltage source 28. The controlled voltage source 28, which for example is a clocked DC voltage circuit or a controlled alternating voltage source, sets the oscillating circuit 21 of the transmitting arrangement 12 into electrical oscillation and maintains the oscillation with a predefined amplitude curve. Moreover, instead of the voltage source 28 a controlled current source is also possible.

By switching the switches 26a to 26c, the frequency of the electrical oscillation is able to be adjusted. To this end, the switches 26a to 26c can be opened or closed independently of one another in any combination. In the present exemplary embodiment of FIG. 2, the switches 26a are closed and the switches 26b and 26c are opened. Moreover, in FIG. 2, three switches 26a to 26c and capacitors 24a to 24c are shown, wherein an oscillating circuit 21 of alternative configuration has more than, or fewer than, three switches 26a to 26c and capacitors 24a to 24c.

The sensor 27 in this case is configured as a voltage meter for registering the voltage Uc, which is applied via the parallel circuit of the capacitors 24a-24c. The purpose of the sensor 27 is to determine the energy distribution in the oscillating circuit 21, i.e. the current state of the oscillation. According to a further exemplary embodiment, therefore, it is also possible for one sensor 27 to be used which determines the field strength of the magnetic field in the coil 22 or the electrical field in the capacitor(s) 24a-24c. The switches 26a to 26c are activated by activation means, not shown.

Figure 3:
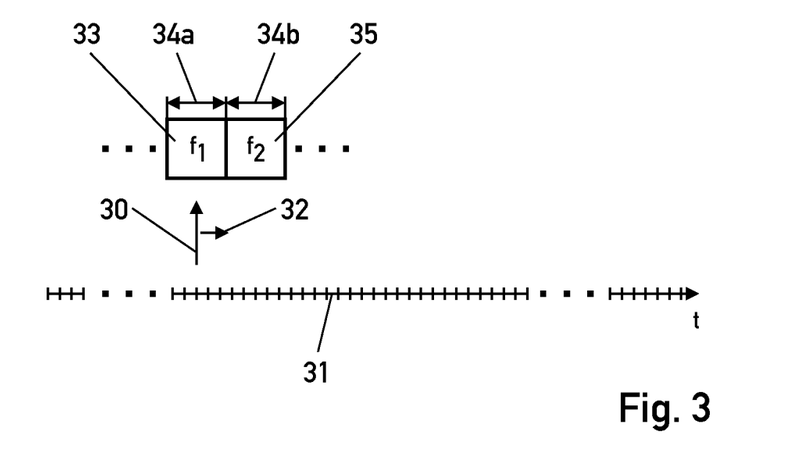
FIG. 3 shows a chronological sequence shown by way of example, taking place in a control logic of the proximity sensor, in accordance with various embodiments of the present disclosure.

FIG. 3 shows a sequence of the selection of a frequency as the selected frequency, shown by way of example, taking place in a control logic, in particular in a time control of the control logic, of a proximity sensor. To this end, the frequencies f1 and f2 are shown, as well as a pointer 30 and a time axis 31. The pointer 30 moves with the time, i.e. with the passage of time, in the direction 32 of the time axis 31 and thus always points to a frequency. At the time shown, the pointer 30 points to the frequency f1, which is thus selected at this time as the selected frequency 33. As the time advances through a time window 34a, i.e. the duration of a time period, the frequency f1 is selected as the selected frequency 33. After the passage of time through the time window 34a, the subsequent frequency f2 which is denoted as the following frequency 35 of the previous currently selected frequency 33, is selected as the newly selected frequency 33 for a time window 34b following the current time window 34a. According to a specific exemplary embodiment, the duration of all of the time windows 34a, 34b is the same length. In FIG. 3, the time windows 34a, 34b which follow one another chronologically are shown, wherein according to a further exemplary embodiment the time windows 34a, 34b are chronologically spaced apart.

The defining of the following frequencies 35 and the selection of the frequencies as the selected frequency 33 for one respective time window 34 is carried out in the control logic, wherein by using activation means of the control logic, the switches 26a to 26c of an oscillating circuit 21, as shown in FIG. 2, are activated, for example. By such an activation, the alternating magnetic field 16 is transmitted at a frequency, wherein the frequency corresponds to the frequency 33 selected at the current transmission time.

Figure 4:
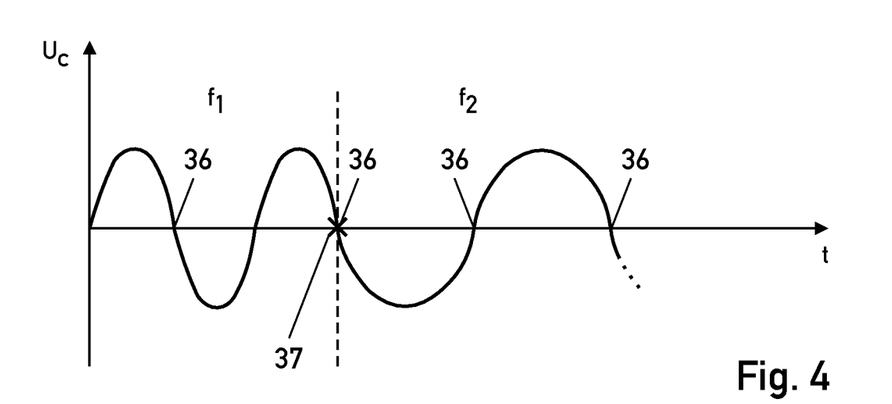
FIG. 4 shows a detail of the time curve of the amplitude of an electrical oscillation in an exemplary embodiment of an oscillating circuit of a transmitting arrangement in, accordance with various embodiments of the present disclosure.

FIG. 4 shows a detail of the time curve of the voltage Uc of an oscillating circuit 21. The time curve of the voltage Uc has a frequency which corresponds to a frequency of the electrical oscillation in the oscillating circuit 21. In the zero crossings 36 of the time curve the total energy of the oscillating circuit 21 in the coil 22 of the oscillating circuit 21 is stored in the form of a magnetic field at a maximum field strength and/or amplitude. In the zero crossings 36, therefore, the switches 26a to 26c are preferably switched over in order to alter the frequency of the electrical oscillation of the oscillating circuit 21. As in the zero crossings 36 no voltage is applied to the capacitors 24a to 24c, i.e. no energy is stored in the form of an electrical field in the capacitors 24a to 24c, by connecting or disconnecting the capacitors 24a to 24c to the switches 26a to 26c in the zero crossings 36, no phase shifts occur in the electrical oscillation. This is shown by way of example in FIG. 4 by the switchover time 37, in which the switches 26a to 26c are switched over so that the electrical oscillation, which has the frequency f1 before the switchover, has the frequency f2 after the switchover at the switchover time 37.

Figure 5:
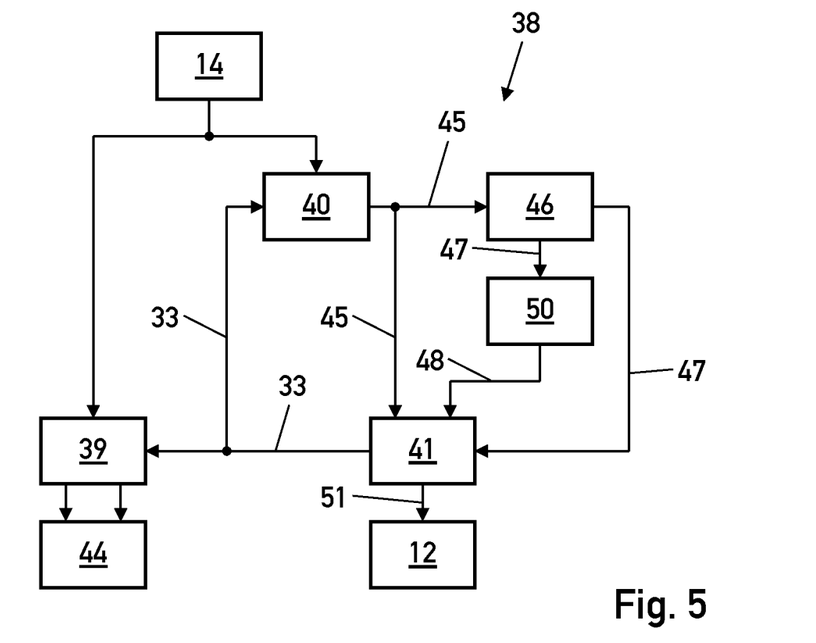
FIG. 5 shows a schematic layout of an exemplary embodiment of the proximity sensor according to the invention, accordance with various embodiments of the present disclosure.

In FIG. 5, the schematic layout of an exemplary embodiment of the proximity sensor 38 is shown. The proximity sensor 38 has the receiving arrangement 14, by which the alternating magnetic field 20 is registered. The registered alternating magnetic field 20, for example after being treated by being converted into an electrical signal, is supplied to an evaluation circuit 39. Moreover, the electrical signal is also supplied to a detection means 40. The proximity sensor 38 additionally comprises a control logic 41, by means of which frequencies are selected as selected frequencies 33 and following frequencies 35 are in each case defined for each selected frequency 33. The frequency 33 currently selected in the control logic 41 is supplied to the evaluation circuit 39 as well as to the detection means 40.

In the evaluation circuit 39, the amplitude and/or the phase of the selected frequency 33, of a frequency derived from the selected frequency 33, the envelope of the selected frequency 33 or the envelope of the frequency of the registered alternating magnetic field 20 derived from the selected frequency 33 are monitored and the proximity and/or degree of proximity to the electrically conductive body 18 are determined therefrom. Moreover, it is also possible, for example using a comparison of the amplitude and/or phase of the monitored frequency of the registered alternating magnetic field 20 as well as the selected frequency 33 of the transmitted alternating magnetic field 16, to determine the degree of proximity and/or a value of the proximity to the electrically conductive body 18. This degree and/or proximity is then displayed by an interface 44, configured as a display, for example. According to a further exemplary embodiment, it is possible to connect a triggering device, not shown here, to the interface 44, by which an event is triggered in the case of a predefined, for example the maximum, proximity.

In the detection means 40, using the selected frequency 33 and using the frequencies and/or frequency components of the detected alternating magnetic field 20 frequencies are determined and/or detected which do not correspond to the frequency of the transmitted alternating magnetic field 16, i.e. the selected frequency 33, and in each case have an amplitude which is above a predefined threshold value. These detected frequencies 45 are supplied to a memory circuit 46 which stores the time curve of all detected frequencies and to a blocking circuit of the control logic 41, not shown.

The detected frequencies 45 or the frequencies of a predefined frequency band are set and/or defined by the blocking circuit of the control logic 41, in each case by one of the detected frequencies 45 as blocked frequencies, and excluded when defining at least one following frequency 35 following the selected frequency 33.

The detected frequencies 45 are stored in the memory circuit 46 and the time curve obtained by storing the detected frequencies 47 over a time period is supplied to a prediction circuit 50. In the prediction circuit 50 further frequencies 48 are predicted using the time curve of the detected frequencies 47. These further frequencies 48 are also supplied to the blocking circuit of the control logic 41 and treated there as detected frequencies 45, i.e. blocked frequencies are defined.

Moreover, by activation means, not shown, of the control logic 41, the transmitting arrangement 12, in particular switches 26a to 26c of the transmitting arrangement 12, are activated by a control signal 51 such that the transmitting arrangement 12 transmits the alternating magnetic field 16 at the selected frequency 33.

Figure 6:
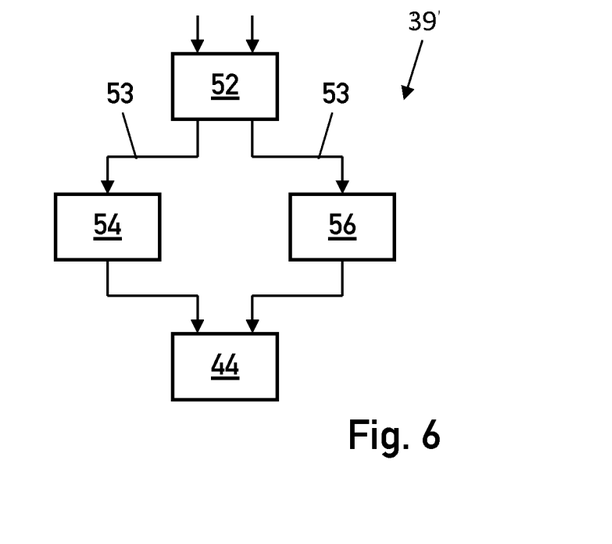
FIG. 6 shows an exemplary embodiment of an evaluation circuit, accordance with various embodiments of the present disclosure.

FIG. 6 shows an advantageous exemplary embodiment of the evaluation circuit 39 with the interface 44. The evaluation circuit 39 has a mixer and/or frequency mixer 52. The registered alternating magnetic field 20 and/or an electrical signal derived from the registered alternating magnetic field 20 are supplied to the frequency mixer 52. Moreover, the selected frequency 33 and/or an electrical signal derived from the selected frequency 33 is supplied to the frequency mixer 52. The two signals are mixed multiplicatively in the frequency mixer 52. The result of the mixing is a mixed signal 53 which is supplied to an amplitude monitoring circuit 54 and to a phase monitoring circuit 56.

In the amplitude monitoring circuit 54 and in the phase monitoring circuit 56, the mixed signal 53 is filtered in each case by a bandpass filter. In the amplitude monitoring circuit 54, for example a bandpass filter is selected which is of narrow band so that when monitoring the amplitudes only the frequency which corresponds to the frequency 33 selected in the time window of the monitoring after mixing is considered. In the phase monitoring circuit 56, however, the bandpass filter is selected to be broader, for example, in comparison with the amplitude monitoring circuit 54, so that phases of the frequencies are also considered which are in a predefined frequency band further "above" or "below" the frequency, which corresponds to the frequency selected in the time window of the monitoring after mixing.

In the amplitude monitoring circuit 54, the amplitude of the mixed frequency or the envelope of the frequency is monitored and, for example, when reaching a specific value of the amplitude and/or when reaching the maximum amplitude, for example, a trigger impulse is transmitted at the interface 44. In the phase monitoring circuit 46, the phase of the mixed frequency or the envelope of the frequency is monitored and in the case of a phase which temporarily alters more rapidly than is predetermined by a further predefined threshold value, a signal is also transmitted to the interface 44, so that a triggering device (not shown) connected to the interface is able to ignore a triggering impulse which is present, in the case of a signal of the phase monitoring circuit 46 occurring in the same time range.

Figure 7:
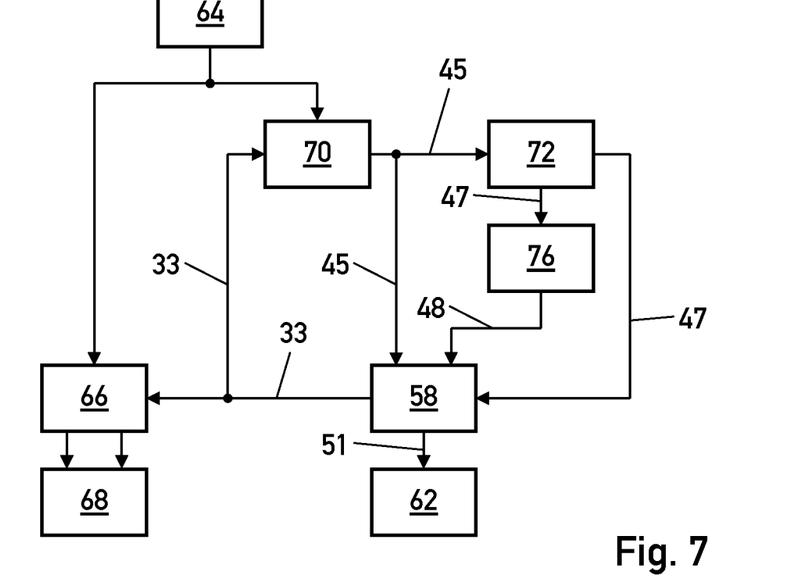
FIG. 7 shows a flow diagram of an exemplary embodiment of the method, accordance with various embodiments of the present disclosure.

FIG. 7 shows in a similar manner to FIG. 5 a flow diagram of an exemplary embodiment of the method according to the invention. In a control step 58, frequencies 33 are selected and following frequencies 35 for the respectively selected frequency 33 are transmitted. In a transmitting step 62, an alternating magnetic field 16 is then transmitted at the respectively selected frequency 33. In a receiving step 64, alternating magnetic fields 20 are registered and in an evaluation step 66 the proximity is determined by evaluating the transmitted alternating magnetic field 16, in particular by comparing with the registered alternating magnetic field 20.

Moreover, in a detection step 70, one or more frequencies of the registered alternating magnetic field 20 are detected, where the frequencies are outside a pre-defined and/or pre-determined frequency band, which encompasses the selected frequency 33, and have an amplitude value above a predefined threshold value. "Predetermined" and/or "predefined" means here that at least the bandwidth and the position of the selected frequency 33 within the frequency band, i.e. the distance and the direction of the selected frequency from the mean frequency of the respective frequency band are defined in advance.

In a blocking step of the control step 58, in each case for one time period, frequencies of a predefined frequency band comprising the detected frequency 45, or a plurality of predetermined frequency bands comprising in each case at least one of the detected frequencies 45, are defined as blocked frequencies. These blocked frequencies are then not defined as following frequencies 35 in the control logic 41 for times of the time period which are within the predefined duration.

Figure 8:
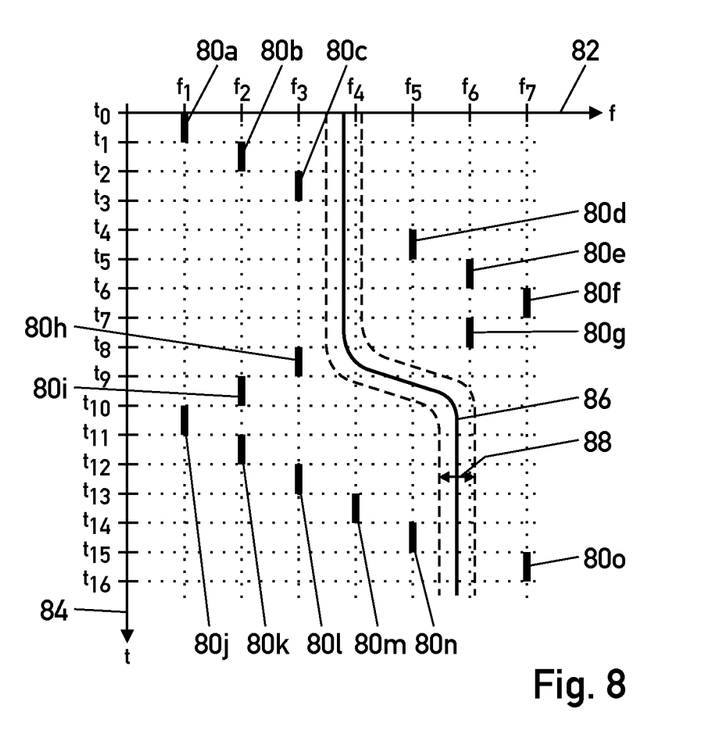
FIG. 8 shows a time curve of the frequency of a transmitted alternating magnetic field as well as an interfering alternating magnetic field, accordance with various embodiments of the present disclosure.

FIG. 8 shows a time curve of the frequency of the alternating magnetic field 16 transmitted by an exemplary embodiment of the invention. This time curve is shown by the lines 80a to 80o. Each of the lines 80a to 80o corresponds in each case to one of the frequencies f1 to f7 to be read off a frequency axis 82. Each line 80a to 80o is additionally assigned to a predefined time window 34, the time thereof being read off a time axis 84. Each time window 34 has in this case the same duration. Each line 80a to 80o thus corresponds to one of the frequencies f1 to f7 which, in a time window 34 able to be read off the frequency axis, has been selected as the selected frequency 33. Thus, for example, from the time t0 to t1, an alternating magnetic field 16 has been transmitted at the frequency f1, from the time t1 to t2, an alternating magnetic field has been transmitted at the frequency f2, etc. The frequency f2 in the time window t1 to t2 corresponds to the following frequency 35 of the previously selected frequency f1 in the previously current time window t0 to t1.

Moreover, the frequency 86 of an interfering magnetic field is shown. This varies over the time curve, namely in the time window from t8 to t10. A frequency band 88 is shown around the frequency 86 of the interfering magnetic field.

If the time curve of the frequencies f1 to f7 is considered, it can be identified that the frequencies are never in the range of the frequency band 88. The reason for this is that in the control logic 41 and/or in the control step 58 only frequencies for subsequent successive frequencies are defined, the frequencies not being detected by the detection means 40 and/or in the detection step 70, and having been excluded by the blocking circuit and/or in the blocking step from the defining process and/or having been defined as blocked frequencies.

Thus the proximity sensor 38 according to the invention and the method according to the invention for determining the proximity to an electrically conductive body 18 permits the proximity to be reliably determined, irrespective of interfering alternating magnetic fields.

All features cited in the above description and in the claims are able to be used individually or in any combination according to the invention. The disclosure of the invention is, therefore, not limited to the disclosed and/or claimed combination of features. Instead, all combinations of individual features are to be considered as disclosed.

What is claimed is:

1. A proximity sensor for determining the proximity to an electrically conductive body, said sensor comprising:
   a transmitting arrangement structured and operable to transmit a transmitted alternating magnetic field at a selected frequency,
   a receiving arrangement structured and operable to register a registered alternating magnetic field,
   a detection means structured and operable to detect one or more frequencies of the registered alternating magnetic field, which are outside a predefined frequency band having the selected frequency and have an amplitude value above a predefined threshold; and
   a control logic comprising:
      a blocking circuit structured and operable to define one of frequencies of a predefined frequency band having a detected frequency, and a plurality of predefined frequency bands each having at least one detected frequency, as blocked frequencies for a predefined time period:
      a selection controller structured and operable to define a following frequency that follows the respectively selected frequency and is different from the respectively selected and the blocked frequencies; and a time control structured and operable to continuously select the respective following frequency of a currently selected frequency as a newly selected frequency that is one of immediately after and chronologically spaced apart from a time window predetermined for the currently selected frequency.

2. The proximity sensor according to claim 1, wherein the transmitting arrangement includes an oscillating circuit having at least one coil and a plurality of capacitors structured and operable to be connected in parallel by switches in any combination with one another, for generating an electrical oscillation at the selected frequency and the transmitted alternating magnetic field resulting from the oscillation, and the control logic further comprises an activation means structured and operable to activate the switches of the oscillating circuit for switching over the frequency of the electrical oscillation.

3. The proximity sensor according to claim 2, wherein the oscillating circuit includes a sensor structured and operable to measure the energy distribution in the oscillating circuit and the activation means are configured in order to switch over the switches of the oscillating circuit, only in the case of one of a maximum energy and an energy within a range of maximum energy measured in the coil.

4. The proximity sensor according to claim 3, wherein the proximity sensor further includes an evaluation circuit including an amplitude monitoring circuit structured and operable to determine proximity by monitoring the amplitude of at least one of the selected frequency, a frequency derived from the selected frequency, an envelope of the selected frequency, and an envelope of the frequency of the registered alternating magnetic field derived from the selected frequency.

5. The proximity sensor according to claim 4, wherein the proximity sensor further includes an evaluation circuit including a phase monitoring circuit structured and operable to monitor the phase of at least one of the selected frequency, a frequency derived from the selected frequency, the envelope of the selected frequency and the envelope of the frequency of the registered alternating magnetic field derived from the selected frequency and to validate the results when determining the proximity.

6. The proximity sensor according claim 5, wherein the evaluation circuit further includes a frequency mixer structured and operable to mix an electrical signal derived from the registered alternating magnetic field and an electrical signal derived from the selected frequency.

7. The proximity sensor according to claim 6, wherein the proximity sensor further includes a memory circuit structured and operable to store a time curve of detected frequencies and a prediction circuit structured and operable to predict further frequencies from the time curve of already detected frequencies and to transmit the further frequencies as detected frequencies to the blocking circuit.

8. The proximity sensor according to claim 7, wherein the control logic includes a correction circuit structured and operable to correct the results of determining the proximity using knowledge of the detected frequencies.

9. A method for determining the proximity to an electrically conductive body, said method comprising:

transmitting a transmitted alternating magnetic field at a selected frequency, receiving and registering a registered alternating magnetic field, detecting one or more frequencies of the registered alternating magnetic field that are outside a predefined frequency band having the selected frequency and have an amplitude value above a predefined threshold value; and controlling the transmitting, receiving and detecting by:

defining as blocked frequencies, for a predefined time period, frequencies of one of a predefined frequency band comprising the detected frequency, and a plurality of predefined frequency bands that each comprise at least one of the detected frequencies, selecting a following frequency following the respectively selected frequency and different from the respectively selected and the blocked frequencies, and continuously selecting as a newly selected frequency the respective following frequency of a currently selected frequency one of immediately after and chronologically spaced apart from a predetermined time window for the currently selected frequency.

10. The method according to claim 9, wherein:

transmitting the transmitted alternating magnetic field at a selected frequency comprises generating an electrical oscillation at the selected frequency and the transmitted alternating magnetic field resulting from the oscillating utilizing an oscillating circuit comprising at least one coil and a plurality of capacitors respectively connectable in any combination with one another in parallel by switches, and the controlling of the transmitting, receiving and detecting comprises activating the switches of the oscillating circuit to switch over the switches to switch the frequency of the electrical oscillation.

11. The method according to claim 10, wherein:

transmitting the transmitted alternating magnetic field at a selected frequency further comprises registering, using at least one sensor the energy distribution in the oscillating circuit, and activating the switches of the oscillating circuit comprises switching over the switched in the case of one of a maximum energy and an energy within the range of maximum energy measured in the coil.

12. The method according to claim 11, further comprising determining, utilizing an amplitude monitoring circuit, the proximity by monitoring at least one of the amplitude of the selected frequency, a frequency derived from the selected frequency, an envelope of the selected frequency, and an envelope of the frequency of the registered alternating magnetic field derived from the selected frequency.

13. The method according to claim 12, further comprising:

monitoring, utilizing a phase monitoring circuit, the phase of at least one of the selected frequency, a frequency derived from the selected frequency, the envelope of the selected frequency, and the envelope of the frequency of the registered alternating magnetic field derived from the selected frequency; and validating the results when determining the proximity.

* * * * *